United States Patent [19]

Yamamoto et al.

[11] Patent Number: 5,293,478
[45] Date of Patent: Mar. 8, 1994

[54] GRAPHICAL DESIGN PROCESSING APPARATUS FOR ASSESSING AND MODIFYING DESIGN OF COMPONENTS

[75] Inventors: Takemi Yamamoto, Nagoya; Hitoshi Yoshida, Kohnan; Katsuhiko Yokoi, Nagoya, all of Japan

[73] Assignee: Brother Kogyo Kabushiki Kaisha, Aichi, Japan

[21] Appl. No.: 629,629

[22] Filed: Dec. 18, 1990

[30] Foreign Application Priority Data

Dec. 28, 1989 [JP] Japan ................................ 1-344609

[51] Int. Cl.$^5$ ............................................. G06F 15/60
[52] U.S. Cl. ................................................... 395/161
[58] Field of Search ........................... 395/155–161, 395/120, 119; 364/506, 508, 474.24, 489

[56] References Cited

U.S. PATENT DOCUMENTS

| | | | |
|---|---|---|---|
| 4,315,315 | 2/1982 | Kossiakoff | 395/140 |
| 4,546,435 | 10/1985 | Herbert et al. | 395/700 |
| 4,730,315 | 3/1988 | Saito et al. | 371/19 |
| 4,813,013 | 3/1989 | Dunn | 395/159 |
| 4,831,525 | 5/1989 | Saito et al. | 395/700 |
| 4,858,146 | 8/1989 | Shebini | 364/512 |
| 4,901,221 | 2/1990 | Kodosky et al. | 395/159 |
| 4,953,094 | 8/1990 | Letcher, Jr. | 364/474.24 X |
| 5,101,436 | 3/1992 | DeAguiar et al. | 395/133 X |
| 5,157,668 | 10/1992 | Buenzli, Jr. et al. | 364/489 X |

OTHER PUBLICATIONS

Patch, "Tool–hooks Up Modeling, Element Analysis", Digital Review, Nov. 7, 1988, p. 36.
Robinson, "Sophisticated Mac CAD Aids Work Group Efforts", MacWEEK, Apr. 18, 1989, p. 32 (2).
O'Malley, "Duo Targets high end PC CAD", PC Week, Oct. 2, 1989, p. 41 (2).
Henning, "AutoSolid", PC User, Jul. 19, 1989, p. 48 (3).
Mills, "DesignView Links Geometry and Equations", Computer Aided Engineering, Sep. 1989, pp. 117–121.
Robinson, "Engineering Sketchbook", Computer Graphics World, Sep. 1989, pp. 117–121.
Freedman, "The Computer Glossary", term: FEA.
"Analyzing Cars By Computer", Computer-Aided Engineering, Oct. 1989, Summary.
"Design Analysis", Computer Graphics World, Oct. 1989, Summary.
Smalley, "CAE Software Saves Time With Earlier Test of Designs", Digital Review, May 2, 1988, p. 31 (2).
McInroy, "Solid Modeling is more than Octrees, Ray Tracings", Gov. Comp. News. Mar. 18, 1988, p. 50 (1).
"Easy CAD v.1.08", Evolution Computing, 1987, pp. 177–251.

Primary Examiner—Gary V. Harkcom
Assistant Examiner—John E. Breene
Attorney, Agent, or Firm—Oliff & Berridge

[57] ABSTRACT

A graphic data processing apparatus including an input device for entering graphic data, a graphic data processing device for generating a visible pattern such as a drawing consisting of points represented by the graphic data, and lines connecting the points, and a display for displaying the generated pattern. The apparatus further includes a pattern data memory for storing pattern data representative of the visible pattern, an assessment data memory for storing assessment data for assessing the visible pattern, and a design assessing device for retrieving from the pattern data memory a portion of the pattern data which relates to at least one specified assessment item. The design assessing device operates to assess the portion of the pattern data against the assessment data, to determine whether the pattern data is adequate or not.

7 Claims, 2 Drawing Sheets

GRAPHICAL DESIGN PROCESSING APPARATUS FOR ASSESSING AND MODIFYING DESIGN OF COMPONENTS

BACKGROUND OF THE INVENTION

1. Field of the Invention

The present invention relates to a graphic data processing apparatus which is capable of generating drawings, figures, and any other geometric, graphical or pictorial visible patterns or representations, and which has a function of assessing the patterns or representations for adequacy and correcting, improving, modifying or otherwise changing the design of the patterns or representations.

2. Discussion of the Prior Art

There is known a graphic data processing apparatus including graphic data processing means adapted to generate a visible pattern such as a drawing, which is defined by points represented by graphic data entered through an input device, and lines connecting the points. The graphic data processing apparatus further includes a display for displaying the points and lines, and the visible pattern defined or formed by these points and lines. For example, the graphic data processing apparatus is used for a computer-aided design (CAD) system adapted to produce design drawings. The use of such graphic data processing apparatus permits more efficient and accurate generation of patterns or drawings, as compared with a manual drawing using pencils, pens or other drawing instruments. Design data representative of such patterns or drawings generated by the graphic data processing apparatus are stored in a memory, with appropriate identification codes or labels, so that the corresponding patterns or drawings may be displayed on the display, drawn or plotted on a paper, or otherwise reproduced, by entering the appropriate identification codes or labels.

Usually, the graphic data processing apparatus of the type indicated above has a function of providing operating or guidance instructions on its display screen, for informing or advising the user of the functions available on the apparatus or the operating procedure. The instructions enable the user to easily operate the apparatus without a prior thorough knowledge on the apparatus, allowing the user to produce with high efficiency and precision desired drawings or other visible patterns which consist of known segments such as straight lines or circular arcs.

Although the graphic data processing apparatus assures relatively easy and accurate generation of desired patterns, there are some problems with the generated patterns, in terms of the function, ease of manufacture, production efficiency and economy and so forth, of an article or member which is represented by the patterns such as design drawings. Namely, the drawings generated by the apparatus cannot be embodied or reduced to practice as contemplated, or do not produce a desired result or does not meet a desired object. In the field of designing machinery using such graphic data processing apparatus, for instance, a component or part of a machine whose design drawing is generated by the apparatus must satisfy various requirements or conditions such as mechanical strength, dimensional accuracy, fit quality or tolerance, stress concentration limit, type and manner of welding, and type of machining, as considered in connection with the other components or parts of the machine. On the other hand, the user of the apparatus who is not sufficiently experienced or skilled in the art as a designer or production engineer may manipulate the apparatus without full considerations of the above-indicated requirements or with inadequate or false judgement or determination relating to those requirements, resulting in defects or flaws in the design as represented or expressed by the generated drawings or patterns.

SUMMARY OF THE INVENTION

It is therefore an object of the present invention to provide a graphic data processing apparatus which permits even an unskilled or unexperienced designer or production engineer to produce or generate a drawing or any other graphical or geometrical visible pattern which is reliable and which meets requirements on an article or member represented by the generated pattern.

The above object may be achieved according to the principle of the present invention, which provides a graphic data processing apparatus including a data input device for entering graphic data, graphic data processing means for generating a visible pattern such as a drawing which consists of points represented by the graphic data and lines connecting the points, and a display for displaying the generated pattern, the apparatus comprising: (a) a pattern data memory for storing pattern data representative of the visible pattern; (b) an assessment data memory for storing assessment data for assessing the visible pattern; and (c) design assessing means for retrieving from the pattern data memory a portion of the pattern data which relates to at least one specified assessment item, and assessing the portion of the pattern data against the assessment data, to determine whether the pattern data is adequate or not.

In the graphic data processing apparatus of the present invention constructed as described above, a desired assessment item or items is/are specified to check the stored pattern data for adequacy against the assessment data stored in the assessment data memory. More specifically, the portion of the pattern data which relates to each assessment item is retrieved from the pattern data memory, and the retrieved portion of the pattern data is assessed by the design assessing means against the stored assessment data. Thus, the user of the apparatus may correct or change already prepared and stored pattern data, so as to meet the requirements that should be satisfied for the article defined by the visible pattern represented by the pattern data. The assessment data are prepared in view of the above requirements which are theoretically and empirically determined by various factors and parameters concerning the function, ease of manufacture and production efficiency and economy of the article, for example. Thus, the present apparatus permits even a relatively unskilled or unexperienced designer or production engineer to formulate visible patterns such as design drawings representative of articles of manufacture or other members or parts, with a sufficiently high degree of design adequacy for practical manufacture of the desired articles. The present graphic data processing apparatus need not be operated or manipulated by a skilled or experienced designer.

The design assessing means may be adapted to operate the graphic data processing means to permit a change or correction of the relevant portion of the pattern data, if the assessment according to the assessment data indicates that that portion of the pattern data is not adequate.

The assessment item or items may be specified by assessment item data entered through the data input device through which are entered the graphic data which are used by the graphic data processing means to initially generate the pattern data.

The design assessing means may be adapted to retrieve a portion of the assessment data which relates to each of the specified assessment items, and assess a part of the pattern data relating to each specified assessment item against the portion of the assessment data.

Preferably, the design assessing means is adapted to provide assessment instructions on the display, according to the assessment data, for aiding the user of the apparatus in assessing the relevant portion of the pattern data for adequacy.

The design assessing means may include calculating means for calculating a value associated with the assessment item, according to the pattern data, and effecting a comparison of the calculated value with a predetermined reference, so that the design assessing means activates the graphic data processing means to change or correct the portion of the pattern data, depending upon a result of the comparison. Where the visible pattern consists of a drawing defining an article of manufacture, the calculating means of the design assessing means may be adapted to calculate the above-indicated value according to at least one condition that should be satisfied for the article of manufacture, as well as the pattern data representative of the the drawing. The condition or conditions that should be satisfied may be entered through the data input device. Preferably, the design assessing means includes means for permitting the user of the apparatus to activate the calculating means, depending upon the user's own judgement according to assessment instructions provided by the design assessing means.

BRIEF DESCRIPTION OF THE DRAWINGS

The above and other objects, features and advantages of the present invention will be better understood by reading the following detailed description of a presently preferred embodiment of the invention, when considered in conjunction with the accompanying drawings, in which.

DETAILED DESCRIPTION OF THE PREFERRED EMBODIMENT

Figure 1:
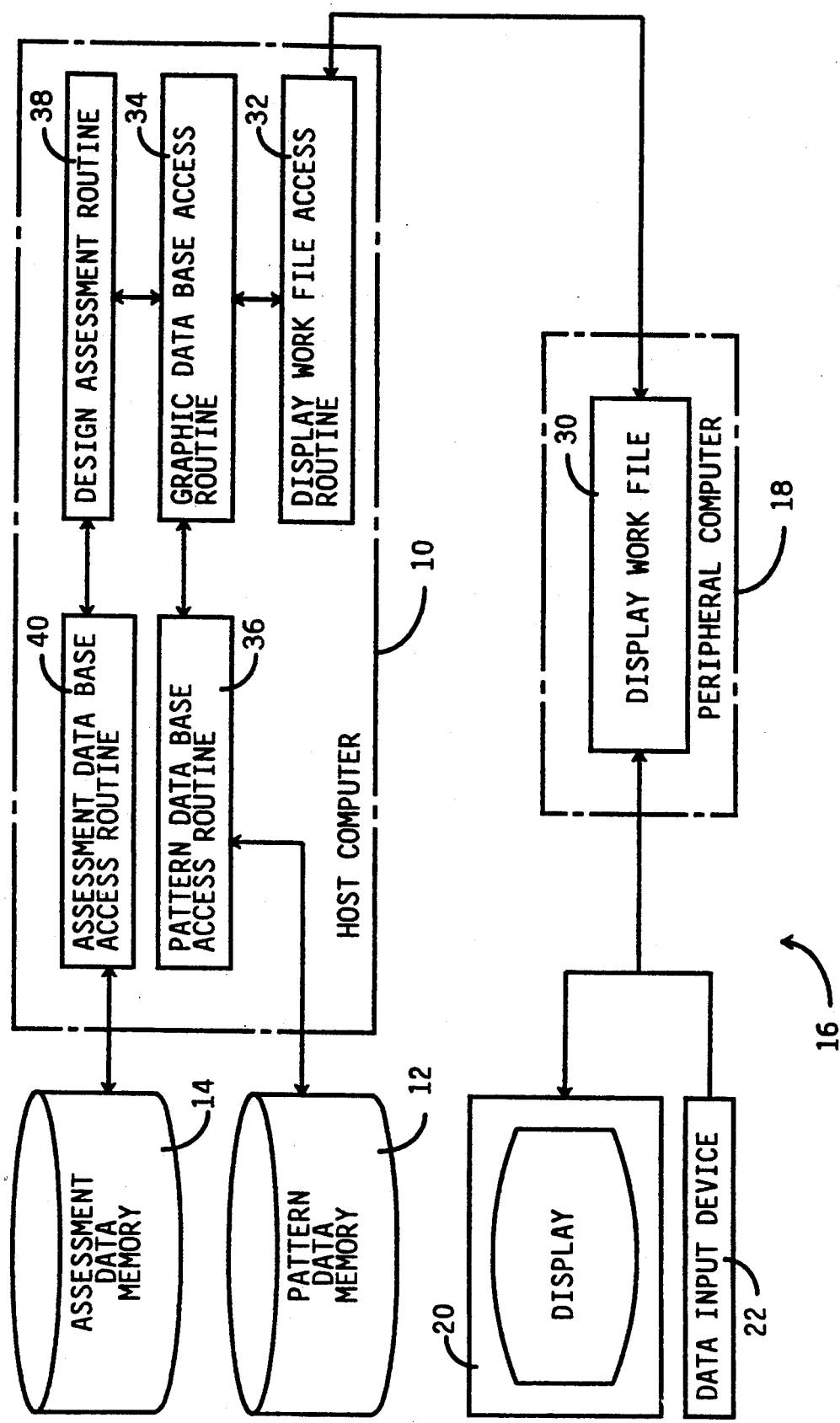
FIG. 1 is a schematic view showing one embodiment of a graphic data processing apparatus of the present invention.

Referring first to FIG. 1 showing a graphic data processing apparatus, reference numeral 10 denotes a host computer which incorporates a central processing unit, a read-only memory, a random-access memory and input/output interface circuits, as well known in the art. To this host computer 10, there are connected a pattern data memory 12 and an assessment data memory 14. The pattern data memory 12 is used to store pattern data in the form of drawing data representative of a drawing or any other visible pattern. The visible pattern such as a drawing defines a machine component or any other article of manufacture, in this embodiment. The assessment data memory 14 stores assessment data used for assessing the pattern data or drawing data. Also connected to the host computer 10 is a peripheral device generally indicated at 16 in FIG. 1. The peripheral device 16 includes a peripheral computer 18 which incorporates a central processing unit, a read-only memory, a random-access memory and input and output interface circuits. The peripheral device 16 also includes a graphic display 20 such as a CRT (cathode-ray tube) and a data input device 22 such as a keyboard, a mouse, a tablet or a light pen. The display 20 is capable of displaying a visible pattern or any graphical or geometrical representation or figure. The data input device 22 is used to enter characters and graphic data for preparing pattern data and for operating or manipulating the host computer 10.

In FIG. 1, various data processing routines or data files (which will be described) are indicated within appropriate blocks labelled as the host computer 10 and peripheral computer 18.

When graphic data such as data indicative of points, and data specifying straight lines and/or curves such as circular arcs and/or spline curves are entered by the user through the data input device 22, the peripheral computer 18 stores in a display work file 30 thereof the data indicative of the points, and operates the display 20 to display these points. At the same time, the peripheral computer 18 sends the entered graphic data indicative of the points and straight lines and/or curves to the host computer 10.

The host computer 10 includes means for executing a display work file access routine 32, and means for executing a graphic data processing routine 34, which receives, through the execution of the display work file access routine 32, the graphic data sent from the peripheral computer 18, so that the graphic data are processed according to the graphic data processing routine 34, to prepare pattern data representative of a drawing defining an article of manufacture, for example. The drawing includes the specified lines which connect the designated points. The prepared pattern data are stored in the pattern data memory 12 through the execution of a pattern data base access routine 36. At the same time, the pattern data are sent to the peripheral device 16 through the display work file access routine 32. Upon reception of the pattern data from the host computer 10, the peripheral computer 18 stores the received pattern data in the display work file 30, and activates the graphic display 20 to display the drawing (straight lines and curves) represented by the pattern data stored in the file 30.

Thus, the user of the graphic data processing apparatus constructed as described above may prepare design drawings of desired machine components, for example, by sequentially entering appropriate sets of graphic data indicative of points and types of lines connecting the points, and by observing the straight and/or curved lines (connecting the specified points) displayed on the display 20. The visible patterns in the form of drawings represented by the stored pattern data prepared from the entered sets of graphic data are identified by labels or codes, and may be displayed on the display 20 or drawn on a paper by a plotter, by entering the appropriate identification labels or codes.

The present graphic data processing apparatus is characterized by a design assessment routine 38 which is executed by the host computer 10 after a batch of pattern data in the form of drawing data representative of a drawing such as a front or side elevational view or a bottom plan view of an article of manufacture such as a machine component has been stored in the pattern data memory 12. The design assessment routine 38 is started in response to a command entered through the data input device 22 by the user. As a result, the graphic display 20 provides design assessment instructions which prompt the user to check the relevant drawing for adequacy of design in various aspects. Further, the design assessment routine 38 gives the user an opportunity of commanding the host computer 10 to analyze the drawing for assessment of the adequacy. As described below in detail, desired assessment items are specified by the user to retrieve corresponding sets of assessment data from the assessment data memory 14 through the execution of an assessment data base access routine 40, so that a portion of the drawing data in the memory 12 which relates to each assessment item is assessed according to the corresponding assessment data.

Thus, the host computer 10 has design assessing means for executing the design assessment routine 38 for assessing drawing data or a drawing represented by the drawing data. An example of the design assessment routine 38 is illustrated in the flow chart of FIG. 2. In this example, the routine 38 is adapted to assess or check a drawing for adequacy in terms of the assessment items such as strength, fit tolerance, stress concentration, and manners or types of welding and machining of a machine component represented by the drawing. The adequacy is assessed for the component per se and in connection with the other components of the machine.

Figure 2:
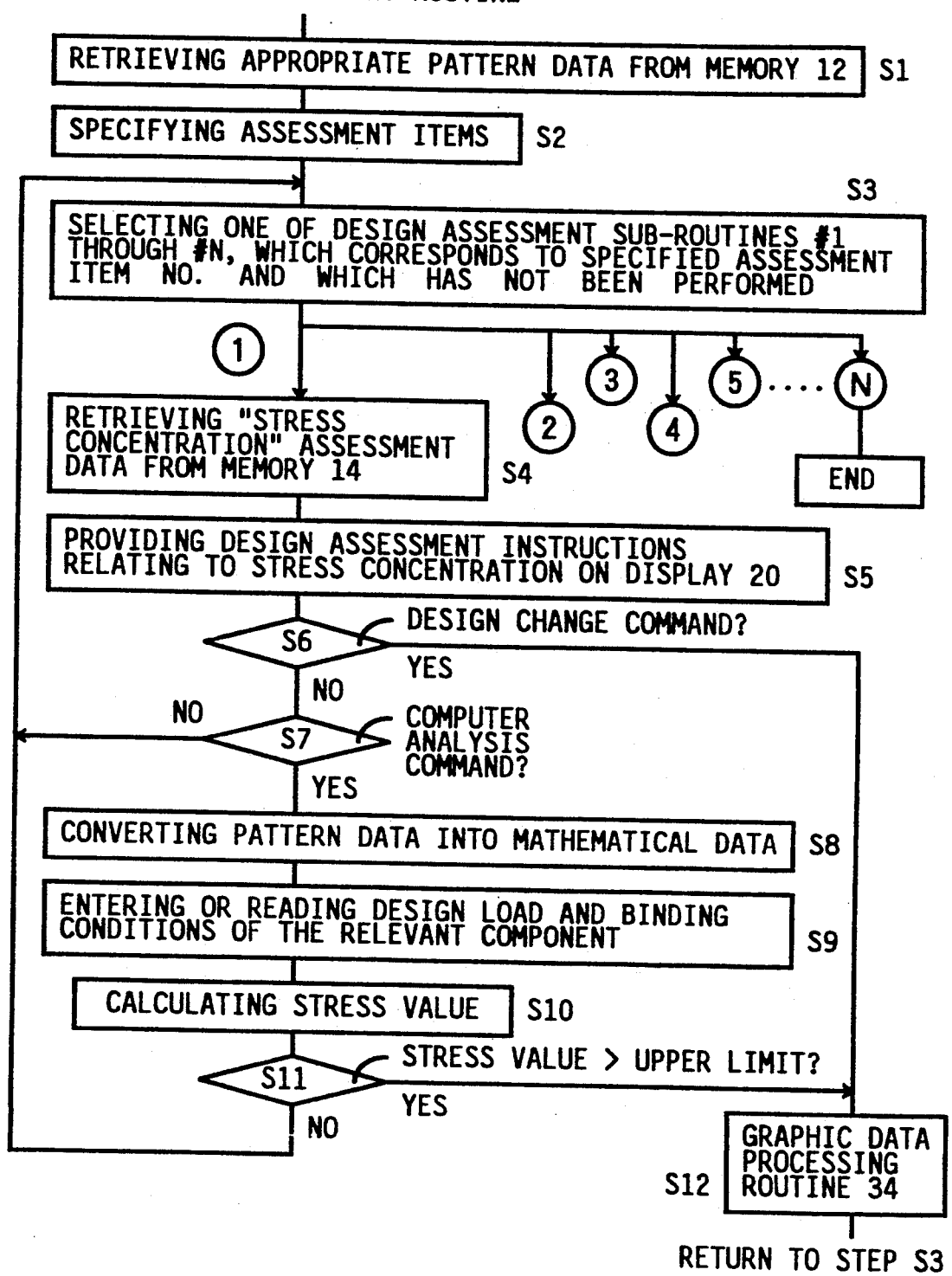
FIG. 2 is a flow chart illustrating a design assessment routine adapted to correct, modify or change an original design.

Referring to FIG. 2, the design assessment routine 38 is started with step S1 in which the host computer 10 retrieves from the pattern data memory 12 a portion of the drawing data (pattern data) which relates to the assessment items No. 1 through No. N which are available on the routine 38. The drawing data stored in the memory 12 include dimension data indicative of the dimensions of the relevant component, data indicative of types and positions of welding to be effected on the component, and data indicative of a surface finish value of the component, for example. Step S1 is followed by step S2 in which the user enters, through the data input device 22, assessment item data that specifies the desired assessment items on which the drawing is to be assessed. For instance, the assessment items Nos. 1 through 4 are the stress concentration, fit tolerance, type of welding and type of machining. Then, the control flow goes to step S3 in which the host computer 10 sequentially selects the specified assessment items Nos. 1 through N, and thereby designates a corresponding one of design assessment sub-routines #1 through #N, which are stored in the ROM of the host computer 10. The designated design assessment sub-routine is executed in the subsequent steps S4 through S12.

Steps S4, S5 and S8 through S11 of FIG. 2 relate to an example where the design assessment sub-routine #1 for the first assessment item No. 1 "stress concentration" is executed. It is to be understood that the specific operations performed in these steps are different from those described in the flow chart, when the other design assessment sub-routines #2 through #N are executed.

Step S3 is followed by step S4 to retrieve from the assessment data memory 14 "stress concentration" data which relate to the assessment item No. 1. The control flow then goes to step S5 in which the host computer 10 activates the graphic display 20 to display design assessment instructions relating to the stress concentration of the component defined by the relevant drawing represented by the drawing data. The design assessment instructions prompt the user to determine whether the relevant drawing satisfies design conditions for minimizing the stress concentration of the component defined by the drawing. Step S5 is followed by step S6 to determine whether a DESIGN CHANGE command has been entered through the data input device 22, or not. This command is entered by the user when the user judges, as a result of consideration of the design assessment instructions, that the drawing represented by the drawing data as currently stored in the pattern data memory 12 should be changed or corrected for reducing the stress concentration value of the component. If the DESIGN CHANGE command has been entered and an affirmative decision (YES) is obtained in step S6, the control flow goes to step S12 in which the graphic data processing routine 34 is executed to change the drawing data for changing the design of the component. During the execution of the graphic data processing routine 34, the user may manipulate the host computer 10 through the peripheral device 16, by entering necessary graphic data for changing the drawing data. If a negative decision (NO) is obtained in step S6, step S7 is implemented to determine whether a COMPUTER ANALYSIS command has been entered through the data input device 22, or not. This command is entered by the user when the user wants to ask the host computer 10 to calculate the stress concentration value of the component as defined by the relevant drawing and compare the calculated value with a predetermined reference value, for automatically assessing the drawing for adequacy in terms of the stress concentration.

In practice, the user enters the DESIGN CHANGE command where it is empirically apparent that the stress concentration value exceeds the permissible upper limit, due to failure of the present drawing to observe the appropriate conditions that should be satisfied for holding the stress concentration value below the upper limit. In this case, step S6 is followed by step S12 as described above, and the relevant portion of the drawing is corrected. Thereafter, the control flow returns to step S3 in which the host computer 10 designates the design assessment sub-routine which corresponds to the next assessment item specified in step S2.

On the other hand, the user wants to proceed with the assessment of the drawing on the next assessment item without any subsequent data changing or assessment operation on the currently selected assessment item, where it is empirically apparent that the stress concentration value is below the permissible upper limit, because all the conditions displayed on the display 20 are met with respect to the stress concentration. In this case, the user enters a suitable command to proceed with the next assessment item, and the control flow goes back to step S3, whereby the design assessment sub-routine #2 on the next assessment item No. 2 "fit tolerance", for example, is effected in the same manner as described above with respect to the assessment No. 1. In the interest of simplification, the flow chart of FIG. 2 does not show this case. If similar operations are effected for all the specified assessment items, the design assessment routine 38 is terminated at the end of the design assessment sub-routine #N.

In the case where the user is not sure whether the stress concentration value exceeds the permissible upper limit or not, the user enters the COMPUTER ANALYSIS command through the data input device 22, whereby an affirmative decision (YES) is obtained in step S7, and the control flow goes to step S8 in which the relevant drawing data are converted into mathematical data relating to the stress concentration, for calculating the stress concentration value of each segments of the component according to a suitable analyzing method. Step S8 is followed by Step S9 in which the host computer 10 reads the nominal design load and design binding conditions of the component which are entered through the data input device 22 or which have been stored in the memory 12. The control flow then goes to step S10 in which the stress concentration values of the individual segments of the component are calculated based on the mathematical data obtained in step S8 and the design load and binding conditions read in step S9. That is, the calculation is effected on the assumption that the nominal design load acts on the article in the specific binding conditions.

Step S10 is followed by step S11 to determine whether any one of calculated stress concentration values of the component is larger than the appropriate upper limit or not. If none of the calculated values are larger than the upper limit, the relevant drawing is acceptable in terms of the stress concentration, and the control flow therefore returns to step S3 to proceed with the next assessment item. If any calculated value is larger than the upper limit, step S11 is followed by step S12 in which the graphic data processing routine 34 is executed to permit a necessary change in the corresponding drawing data to change the design of the relevant component.

In the present embodiment of the graphic data processing apparatus of the invention described above, portions of the pattern data in the form of the drawing data which relate to specified design assessment items are retrieved from the pattern data memory 12 and are assessed according to the respective design assessment sub-routines, based on the corresponding sets of assessment data which are retrieved from the assessment data memory 14. Accordingly, even an unskilled or unexperienced designer may design a desired article of manufacture, by correcting or modifying necessary portions of the corresponding drawing or pattern data once prepared and stored in the memory 12, so that the designed article of manufacture meets the required conditions in connection with the function, ease of machining and production efficiency and economy.

While the present invention has been described in its presently preferred embodiment for illustrative purpose only, it is to be understood that the invention is not limited to the details of the illustrated embodiment, but may be otherwise embodied.

For instance, the graphic data processing apparatus may use a single computer, rather than the host computer 10 and the peripheral computer 18 which are employed in the illustrated embodiment.

In the illustrated embodiment, steps S8 through S11 are implemented only when the COMPUTER ANALYSIS command is entered through the data input device 22, namely, only when an affirmative decision (YES) is obtained in step S7. However, the design assessment routine 38 may be adapted such that these steps S8–S11 are always implemented. In this case, the control flow goes directly to step S8 if a negative decision is obtained in step S6.

It is to be understood that the invention may be embodied with various other changes, modifications and improvements, which may occur to those skilled in the art, without departing from the spirit and scope of the invention defined in the following claims.

What is claimed is:
1. A graphic data processing apparatus comprising:
   a data input device for entering graphic data and assessment item data, said graphic data including data representative of points defining a drawing of an article of manufacture, said assessment item data specifying at least one assessment item;
   graphic data processing means for generating, according to said graphic data, drawing data representative of said article of manufacture, said drawing data including said data representative of said points and data representative of lines connecting the points;
   a display for displaying a drawing corresponding to the generated drawing data;
   a pattern data memory for storing the drawing data representative of said drawing;
   an assessment data memory for storing assessment data; and
   design assessing means for retrieving from said pattern data memory a retrieved portion of said drawing data, the retrieved portion relating to at least one assessment item specified by said assessment item data, and assessing said retrieved portion of the drawing data, for each of said at least one assessment item, based on a portion of said assessment data relating to said at least one assessment item,
   said design assessing means including:
   (a) means for displaying design assessment instructions on said display, according to said retrieved portion of said assessment data, so that a user of the apparatus is aided in assessing adequacy of said retrieved portion of said drawing data, for said each assessment item,
   (b) means for rendering said graphic data processing means operable to permit a user of the apparatus to revise said retrieved portion of the drawing data in response to an assessment by said user, according to said design assessment instructions, that said retrieved portion of said drawing data is not acceptable,
   (c) determining means for determining at least one physical value of said article of manufacture associated with said each assessment item, based on at least said retrieved portion of said drawing data, and
   (d) decision means for deciding whether said at least one physical value calculated by said determining means is acceptable, by comparing each calculated physical value with a predetermined reference value, said decision means rendering said graphic data processing means operable to permit the user of the apparatus to change said retrieved portion of the drawing data, in response to a result of said comparison.

2. The graphic data processing apparatus of claim 1, wherein said determining means determines said at least one value based on a nominal load acting on said article of manufacture, and at least one design binding condition in which said nominal load acts on said article of manufacture.

3. The graphic data processing apparatus of claim 2, wherein said at least one design binding condition is input by the user of the apparatus through said data input device.

4. The graphic data processing apparatus of claim 1, wherein said design assessing means further comprises means for permitting a user of the apparatus to activate said determining means.

5. The graphic data processing apparatus of claim 1, wherein said graphic data processing means and said design assessing means comprise a computer connected to said data input device, said display, said pattern data memory and said assessment data memory.

6. The graphic data processing apparatus of claim 1, wherein said design assessing means further comprises means for permitting a user of the apparatus to specify one of a plurality of assessment items, by entering said assessment item data through said data input device.

7. The graphic data processing apparatus of claim 6, wherein said plurality of assessment items comprises at least one assessment item selected from a mechanical strength, a fit tolerance and a stress concentration of said article of manufacture, and wherein said determining means determines as said at least one physical value said a value representative of said mechanical strength, a value representative of said fit tolerance and a value representation of stress concentration, in response to, respectively, said mechanical strength, said fit tolerance and said stress concentration being specified by said user.

* * * * *